(12) United States Patent
Vijayakumar et al.

(10) Patent No.: US 11,892,484 B2
(45) Date of Patent: Feb. 6, 2024

(54) PSUEDO DIGITAL ASK DEMODULATOR WITH INTEGRATED BUCK BOOST AND USB-PD FOR WIRELESS CHARGING

(71) Applicant: Cypress Semiconductor Corporation, San Jose, CA (US)

(72) Inventors: Prasanna Venkateswaran Vijayakumar, Bangalore (IN); Arun Khamesra, Bangalore (IN); Jegannathan Ramanujam, Bangalore (IN); Ravi Konduru, Bengaluru (IN)

(73) Assignee: Cypress Semiconductor Corporation, San Jose, CA (US)

( * ) Notice: Subject to any disclaimer, the term of this patent is extended or adjusted under 35 U.S.C. 154(b) by 198 days.

(21) Appl. No.: 17/669,706

(22) Filed: Feb. 11, 2022

(65) Prior Publication Data

US 2023/0258694 A1 Aug. 17, 2023

(51) Int. Cl.
*G01R 19/10* (2006.01)
*H02J 50/80* (2016.01)
*G01R 31/30* (2006.01)
*H04L 27/06* (2006.01)
*H02J 50/12* (2016.01)

(52) U.S. Cl.
CPC ......... *G01R 19/10* (2013.01); *G01R 31/3004* (2013.01); *H02J 50/12* (2016.02); *H02J 50/80* (2016.02); *H04L 27/06* (2013.01)

(58) Field of Classification Search
CPC ..... G01R 19/10; G01R 31/3004; H02J 50/80; H02J 50/12; H04L 27/06
See application file for complete search history.

(56) References Cited

U.S. PATENT DOCUMENTS

| | | | |
|---|---|---|---|
| 9,722,448 B2* | 8/2017 | Radovic ............... | H02J 50/40 |
| 11,277,034 B1* | 3/2022 | Peralta ............... | H02J 50/23 |
| 11,277,035 B1* | 3/2022 | Kasireddy ........... | H02J 50/90 |
| 11,303,165 B2* | 4/2022 | Peralta ............... | H02J 50/80 |
| 11,374,621 B2* | 6/2022 | Katz .................. | H04B 5/0037 |
| 11,431,205 B2* | 8/2022 | Peralta ............... | H02J 50/12 |

(Continued)

FOREIGN PATENT DOCUMENTS

CN 114362299 A * 4/2022
WO WO-2022164194 A1 * 8/2022

*Primary Examiner* — Adam D Houston

(57) ABSTRACT

Disclosed are techniques for using a sense amplifier for the voltage path having an adjustable gain and a current amplifier for the current path having an adjustable sample-hold interval for demodulation of in-band ASK data in power transmitting devices of a wireless charging system. The sample-hold interval may be adjusted as a function of the error rate of the demodulated data and used to sample the modulated current when the adjustable gain of the voltage path is not able to track the modulated voltage. The adjustable sample-hold may function as a variable reference of a comparator used to compare the sampled current to generate the sensed current. A controller may flexibly adjust the gain, adjust the sample-hold interval, and/or select the sensed voltage or the sensed current path for further filtering, demodulation, decoding, and processing depending on the error rate under various loading, coupling scenarios, and phases of power transfer.

20 Claims, 7 Drawing Sheets

(56) References Cited

U.S. PATENT DOCUMENTS

| | | | |
|---|---|---|---|
| 11,735,962 B2* | 8/2023 | Schwartz | H01F 27/36 |
| | | | 320/108 |
| 2006/0220786 A1* | 10/2006 | Hagl | B60R 25/24 |
| | | | 340/5.61 |
| 2020/0403455 A1* | 12/2020 | AbuKhalaf | H02J 50/80 |
| 2021/0384754 A1* | 12/2021 | Xu | H01F 7/0247 |
| 2021/0398733 A1* | 12/2021 | Moussaoui | H01F 27/24 |
| 2023/0047559 A1* | 2/2023 | Kim | H02J 50/60 |
| 2023/0063671 A1* | 3/2023 | Song | H02J 50/80 |
| 2023/0258694 A1* | 8/2023 | Vijayakumar | G01R 31/3004 |
| | | | 375/317 |
| 2023/0259480 A1* | 8/2023 | Narayana Iyer | G06F 13/4295 |
| | | | 710/105 |
| 2023/0283114 A1* | 9/2023 | Wadkar | H02J 50/20 |
| | | | 307/104 |

* cited by examiner

PSUEDO DIGITAL ASK DEMODULATOR WITH INTEGRATED BUCK BOOST AND USB-PD FOR WIRELESS CHARGING

This disclosure generally relates to technologies for wireless charging, and more particularly, to methods and systems for wireless charging transmitters to demodulate data sent back by a wireless charging receivers over the power delivery signal.

BACKGROUND

Wireless charging systems allow batteries of portable devices to be charged wirelessly through inductive coupling of alternating current (AC) power signals transmitted by charging transmitters. Wireless charging standard such as the Qi specification promulgated by the Wireless Power Consortium defines the use of in-band communication between power transmitting devices and power receiving devices. For example, Qi standard based wireless charging system uses amplitude shift keying (ASK) to modulate the AC power signal transmitted within the frequency band of 110 KHz to 250 KHz. When a power receiving device is placed on a transmitter mat, the receiving device modulates the power signal at rate of ~2 KHz with at least 200 mV or 15 mA depth and uses this ASK communication to send messages that negotiate, regulate and safeguard the power transfer. The transmitting device demodulates the ASK signal, takes corrective action and may acknowledge the ASK signal via in-band frequency shift keying (FSK).

The receiving device may use resistive, capacitive, or mixed modulation schemes to communicate data back to the transmitting device via ASK. Since the power transfer may happen by varying one or more of frequency, voltage, duty cycle or phase of the AC signal of magnetically coupled coils, the in-band ASK signal quality may be affected significantly during start-up, transient and steady-state conditions. The ASK signal quality is further affected by the coupling factor, which is dependent on the alignment between the transmitting device and the receiving device. As such, demodulation of ASK signal by the transmitting device may be challenging.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
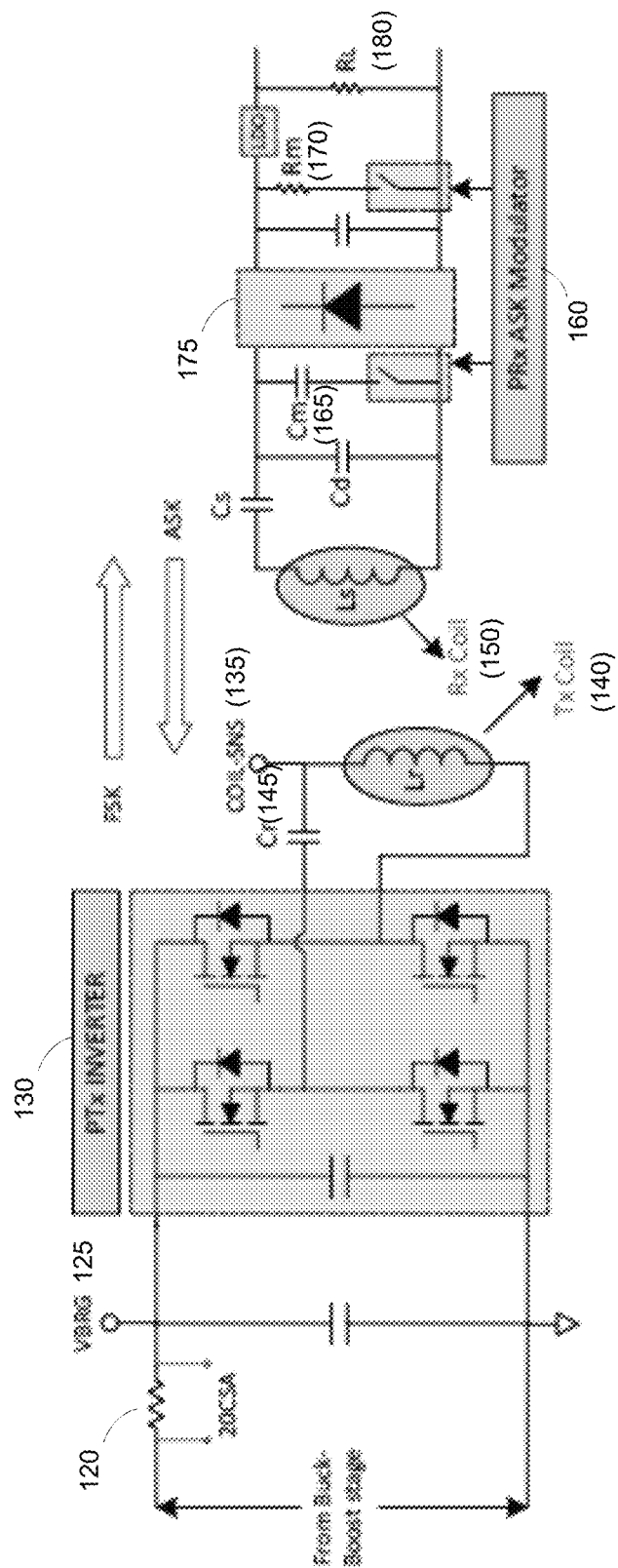
FIG. 1 depicts a scenario for in-band communication between a power transmitting device and a power receiving device in a wireless charging system in which the power receiving device modulates the power AC signal using ASK to transmit data to the power transmitting device and the power transmitting device modulates the power AC signal using FSK to transmit data to the power receiving device in accordance with one aspect of the present disclosure.

Examples of various aspects and variations of the subject technology are described herein and illustrated in the accompanying drawings. The following description is not intended to limit the invention to these embodiments, but rather to enable a person skilled in the art to make and use this invention.

Qi standard specifies in-band ASK communication for data communication (handshake, regulation, protection and security) from a power receiving device (also referred to as a wireless power receiver or the load) to a power transmitting device (also referred to as a wireless power transmitter or the source). For example, the wireless power receiver may send a control error packet (CEP) at certain interval to the wireless power transmitter over the ASK in-band communication containing information about rectified output voltage error. The wireless power transmitter may use the CEP packet to regulate the power received by the wireless power receiver. To send data over the AC power signal using in-band ASK, the wireless power receiver modulates the load impedance seen by the wireless power transmitter. The wireless power receiver may modulate the power signal by switching a capacitor on a tank output or a resistor on the output of a voltage rectifier. The modulator of the wireless power receiver may switch at 2 KHz and the modulation in the load impedance is seen at the voltage or current of the magnetically coupled coil of the wireless power transmitter or in an inverter bridge providing the AC power to the coil. The wireless power transmitter may demodulate the modulation of the voltage or the current to decode the ASK data to regulate the power transfer.

The modulated voltage or current seen by the wireless power transmitter may not have consistent signal to noise (SNR) throughout the range of operating frequencies and load currents. This is because the modulation depth at the wireless power receiver may vary as a function of the operating frequency and the load current. The modulation depth may also vary as a function of design considerations, determined by variables such as the transmitter-to-receiver coil ratio, coupling, quality factor of coils used, etc. To reliably demodulate the ASK data under various load impedance, coupling scenarios, and modulator designs, the ASK demodulator may need flexibility in the current and voltage paths.

Disclosed are techniques for using a sense amplifier for the voltage path having an adjustable gain and a current amplifier for the current path having an adjustable sample-hold interval for ASK demodulation. The sample-hold interval may be adjusted as a function of the error rate of the demodulated data and may be used to sample the modulated current when the adjustable gain of the voltage path is not able to track the modulated voltage. The adjustable sample-hold may effectively function as a variable reference of a comparator used to compare the sampled current to generate the sensed current. The sensed voltage and the sensed current may have independent filter, programmable gain, comparator, and/or sample-and-hold paths to extract ASK data with low modulation depths and variable reflected load impedance while maintaining power regulation. A controller may flexibly adjust the gain, adjust the sample-hold interval, and/or select the sensed voltage or the sensed current path for further filtering, demodulation, decoding, and processing via firmware depending on the error rate under various loading, coupling scenarios, and phases of power transfer.

FIG. 1 depicts a scenario for in-band communication between a power transmitting device and a power receiving device in a wireless charging system in which the power receiving device modulates the power AC signal using ASK to transmit data to the power transmitting device and the power transmitting device modulates the power AC signal using FSK to transmit data to the power receiving device in accordance with one aspect of the present disclosure.

A DC voltage 125 from a buck or a boost stage of a DC/DC converter may be supplied to a full-bridge inverter stage 130 of the power transmitting device. The full-bridge inverter stage 130 may convert the DC voltage 125 to an AC square wave to feed the resonant tank formed by the transmitter coil 140 and resonant capacitor 145. The power transmitting device may control the voltage, frequency, phase angle or duty cycle of the full-bridge inverter stage 130 to regulate the power transfer at the power receiving device. The operating parameters of the full-bridge inverter stage 130 such as output voltage, bridge current may be a function of the frequency, coupling, DC input voltage, load of the power receiving device, coil parameters of the power receiving device, etc.

The AC power signal from the transmitter coil 140 is inductively coupled to the receiving coil 150 of the power receiving device. A voltage rectifier stage 175 may rectify the AC power to a DC voltage to drive a load 180 such as a rechargeable battery of the power receiving device. The power receiving device may modulate the AC power signal at 2 KHz by switching the modulator capacitor 165 under a capacitive modulation scheme or the modulator resistor 170 under a resistive modulation scheme.

The effect of the modulator switching is seen at the coil voltage 135 of the transmitter coil 140 or in the current of the DC voltage 125 flowing into the full-bridge inverter stage 130. In one embodiment, the coil voltage 135 or the voltage of the resonant capacitor 145 may be sensed in each half of the AC power cycle to provide the voltage path for ASK demodulation. The bridge current may be sensed by measuring the voltage drop across a current sensing resistor 120 placed in series with the full-bridge inverter stage 130 to provide the current path for ASK demodulation. The sensed current may also be used to regulate the operation of the buck/boost stage, or for power loss measurement to detect foreign objects in the field of the AC power. In one embodiment, the demodulated analog signal swing may have at least 100 mV depth. The power transmitting device may transmit data to the power receiving device through in-band FSK by modulating the switching frequency of the full-bridge inverter stage 130 to change the voltage of the receiving coil 150.

Figure 2:
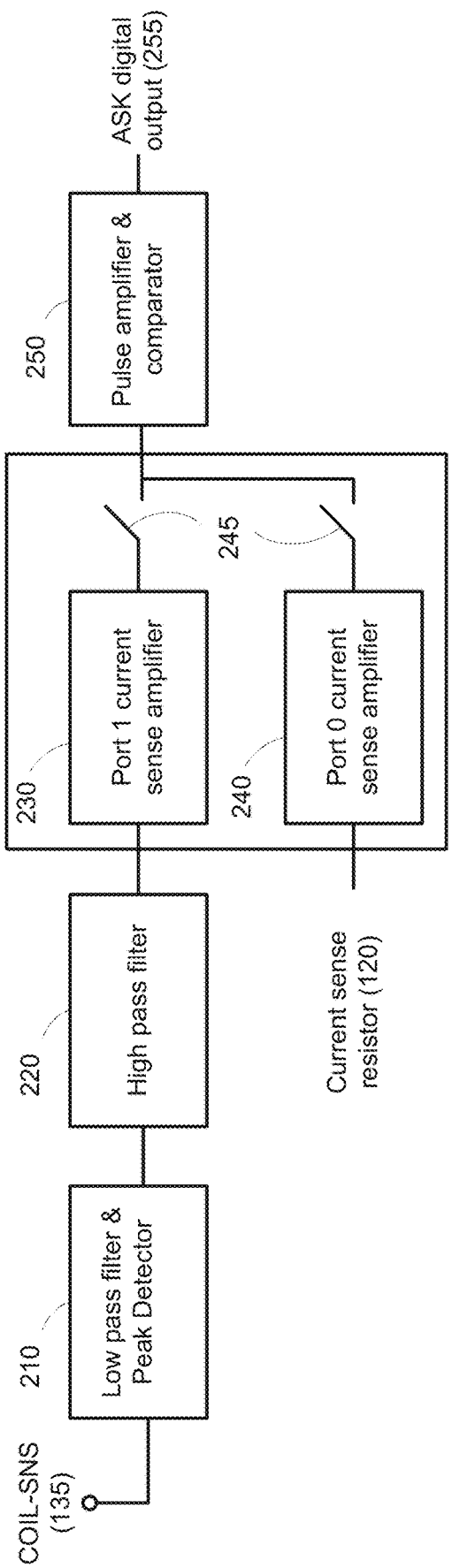
FIG. 2 illustrates the power transmitting device selectively using a voltage sensing circuit that senses the voltage of the coil and a current sensing circuit that senses the current flowing into the full-bridge inverter to demodulate the ASK data in accordance with one aspect of the present disclosure.

FIG. 2 illustrates the power transmitting device selectively using a voltage sensing circuit that senses the voltage of the coil and a current sensing circuit that senses the current flowing into the full-bridge inverter to demodulate the ASK data in accordance with one aspect of the present disclosure. The voltage path for the ASK demodulation is derived from the coil voltage 135. A low pass filter and peak detector block 210 may filter and detect the peak of the 2 KHz ASK modulation of the coil voltage 135 from the 110 KHz to 250 KHz AC power signal. A high pass filter 220 may filter the 2 KHz ASK modulation to remove any DC bias and to shift the voltage level of the AC signal. In one embodiment, common mode and differential mode filters may be used to further improve noise immunity.

A current sense amplifier 230 (e.g., a differential amplifier of port 1) with an adjustable gain for the voltage path may amplify the modulated voltage. In one embodiment, a controller of the power transmitting device may configure the adjustable gain to extract data with lower modulation depth. In one embodiment, the current sense amplifier 230 may be implemented as a voltage-to-current detector with variable gain. In one embodiment, the amplified voltage from current sense amplifier 230 may be filtered by a bandwidth filter and compared with an adjustable reference voltage to extract the modulated voltage.

The current path for the ASK demodulation is derived from the voltage drop across the current sensing resistor 120. A current sense amplifier 240 (e.g., a differential amplifier of port 0) may also have an adjustable gain to provide the flexibility to vary the modulation information contained in the current path. A sampling circuit with an adjustable sample-hold interval may be used to sample the modulated current of the amplifier output. The adjustable sample-hold may effectively function as a variable reference of a comparator used to compare the sampled current to generate the sensed current. In one embodiment, the adjustable sample-hold circuit may sample the modulated current when the adjustable gain of the voltage path is not able to track the signal due to external filtering or common mode movements. The voltage path and the current path may have independent filter, programmable gain, comparator, and/or sample-and-hold paths to extract ASK data with low modulation depths and variable reflected load impedance while maintaining power regulation.

An analog mux 245 under the control of the controller may select the sensed voltage from the voltage path or the sensed current from the current path for further filtering, decoding, and processing. A pulse amplifier and comparator block 250 may process the selected path through a low pass filter and DC blocking circuit to generate clean 2 KHz modulated signal. The modulation depth, however, may not always be high enough to generate a reliable ASK output. A gain stage of the pulse amplifier and comparator block 250 may amplify the 2 KHz modulated signal and add a DC bias. A comparator stage of the pulse amplifier and comparator block 250 may compare the amplified signal from the gain stage to generate ASK digital output 255. A processor may read the ASK digital output 255 to demodulate, decode, and verify the integrity of the ASK data.

During power transfer, the modulation depth from a particular path may go low, resulting in no discernible output or a distorted output from the comparator stage. The processor may read the ASK digital output 255 to control the voltage path and the current path for the ASK demodulation.

In one embodiment, the controller may flexibly adjust the gains of the voltage path or the current path, adjust the sample-hold interval of the current, and/or toggle the analog mux 245 to change the selection of the voltage or the current path for processing by the pulse amplifier and comparator block 250 depending on the error rate under various loading, coupling scenarios, and phases of power transfer.

For example, the processor may initially select the voltage path to demodulate the ASK data. If the processor determines that the demodulated data has a data rate higher than a threshold or that the demodulated data is static, the processor may change the gain of the current sense amplifier 230 of the voltage path or may select the current path for ASK demodulation. In another example, the processor may initially select the current path to demodulate the ASK data using a first sample-hold interval. If the processor determines that the demodulated data has a data rate higher than a threshold or that the demodulated data is static, the processor may change the first sample-hold interval to effectively adjust the reference voltage used to compare against the sampled current to generate the sensed current.

Figure 3:
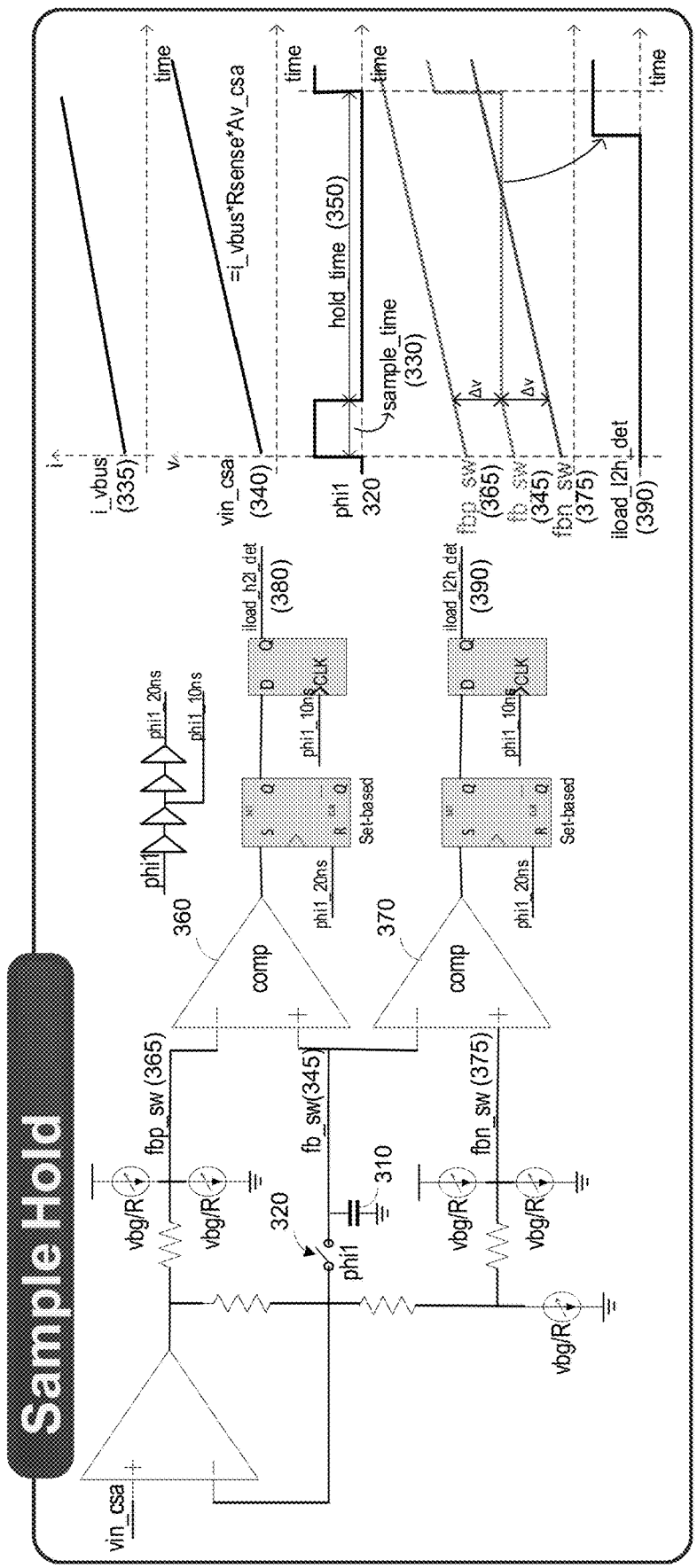
FIG. 3 illustrates an adjustable sample-hold circuitry used for sampling the current flowing into the full-bridge inverter by the current sensing circuit in accordance with one aspect of the present disclosure.

FIG. 3 illustrates an adjustable sample-hold circuitry used for sampling the current flowing into the full-bridge inverter by the current sensing circuit in accordance with one aspect of the present disclosure.

The output of a differential amplifier in the current path such as the current sense amplifier 240 of FIG. 2 may charge a sampling capacitor 310 or cause the sampling capacitor 310 to discharge through a sampling switch 320. A processor may control the time interval when the sampling switch 320 is closed to control the sample time 330 of the sample-hold cycle. For example, when the differential amplifier senses a rising voltage (vin_csa 340) due to a change in the current (i_vbus 335) flowing into the full-bridge inverter, the sampling switch 320 may be closed partially during the rising voltage (vin_csa 340) to charge the sampling capacitor 310. The voltage of the sampling capacitor 310 may be charged to a level as shown (fb_sw 345). When the sampling switch 320 is open after the sample time 330, the voltage of the sampling capacitor 310 is held at the charged level during the hold time 350 of the sample-hold cycle.

Two comparators may compare the voltage of the sampling capacitor 310 with two different reference voltages. A first comparator 360 may compare the sampling capacitor voltage (fb_sw 345) received at the positive input with a first reference voltage (fbp_sw 365)) received at the negative input. A second comparator 370 may compare the sampling capacitor voltage (fb_sw 345) received at the negative input with a second reference voltage (fbn_sw 375)) received at the positive input. The first reference voltage (fbp_sw 365)) and the second reference voltage (fbn_sw 375)) may be rising voltage ramp. The sampling capacitor voltage (fb_sw 345) may be lower than the first reference voltage (fbp_sw 365)), causing the output of the first comparator 360 to generate a low output. The sampling capacitor voltage (fb_sw 345) may be initially higher than the second reference voltage (fbn_sw 375)), causing the output of the second comparator 360 to also generate a low output. When the rising voltage on the second reference voltage (fbn_sw 375)) exceeds the held voltage of the sampling capacitor voltage (fb_sw 345), the second comparator 360 triggers to generate a high output. A latch circuitry may generate a sampled output (iload_l2h_det) from the second comparator 360.

By adjusting the sample time 330 of the adjustable sample-hold circuitry, the processor may effectively adjust the first reference voltage (fbp_sw 365)) and the second reference voltage (fbn_sw 375)) of the comparators. Thus, the adjustable sample-hold circuitry effectively functions as a moving reference voltage of the comparators used to compare the sampled current to generate the sensed current. As mentioned, the sample time 330 may be adjusted as a function of the error rate of the demodulated data and may be used to sample the modulated current when the adjustable gain of the voltage path is not able to track the modulated voltage under various loading, coupling scenarios, and phases of power transfer.

Figure 4:
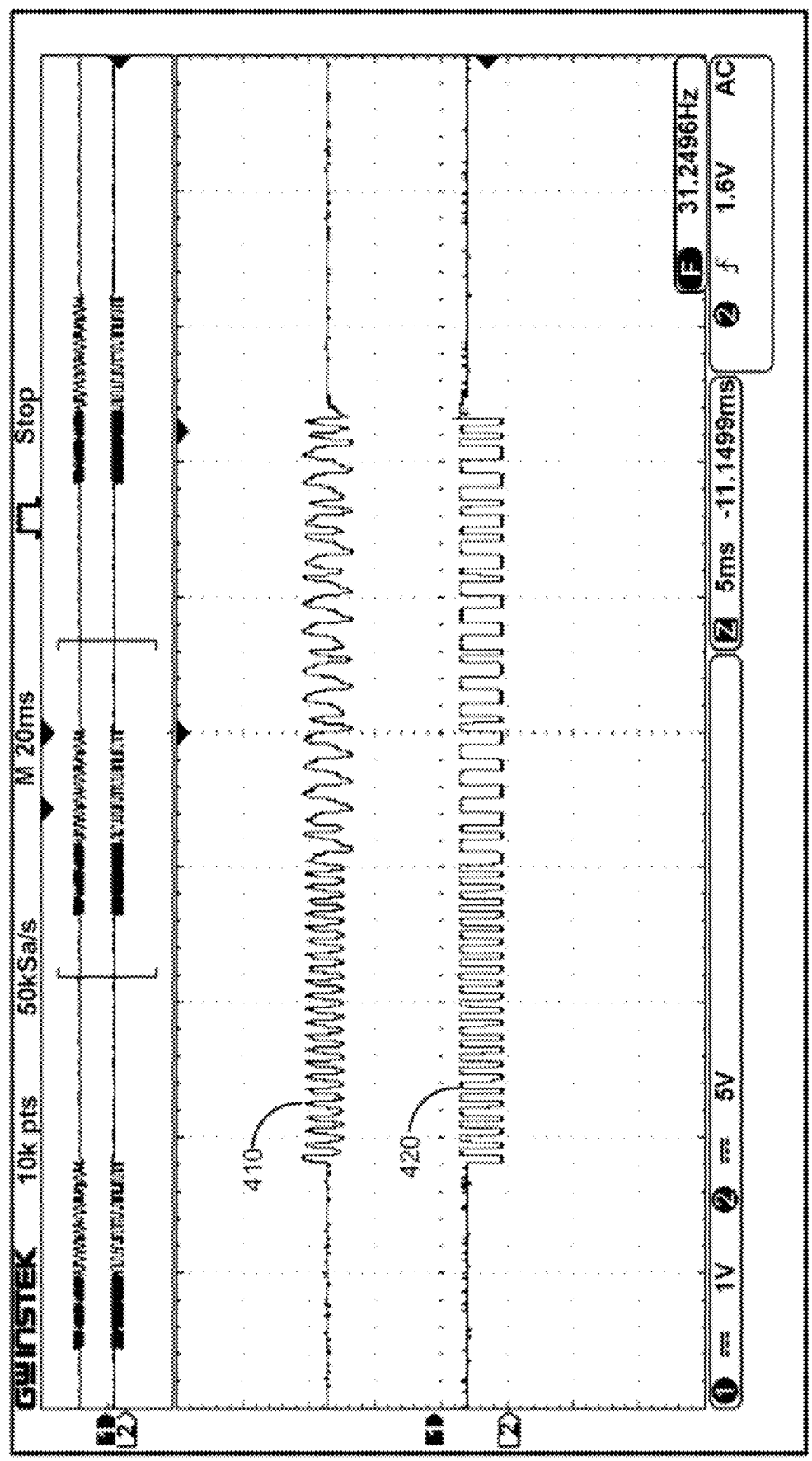
FIG. 4 illustrates the output of the voltage sensing circuit when there is ASK modulated data in accordance with one aspect of the present disclosure.

FIG. 4 illustrates the output of the voltage sensing circuit when there is ASK modulated data in accordance with one aspect of the present disclosure. The output of the differential amplifier (e.g., current sense amplifier 230) with an adjustable gain may amplify the ASK modulated voltage to generate the amplified voltage 410. The ASK modulation may be generated by the power receiving device using a capacitive modulation scheme. The amplified voltage 410 may be filtered and compared with an adjustable reference voltage to extract the sensed voltage 420 having sufficient modulation depth for use in ASK demodulation.

Figure 5:
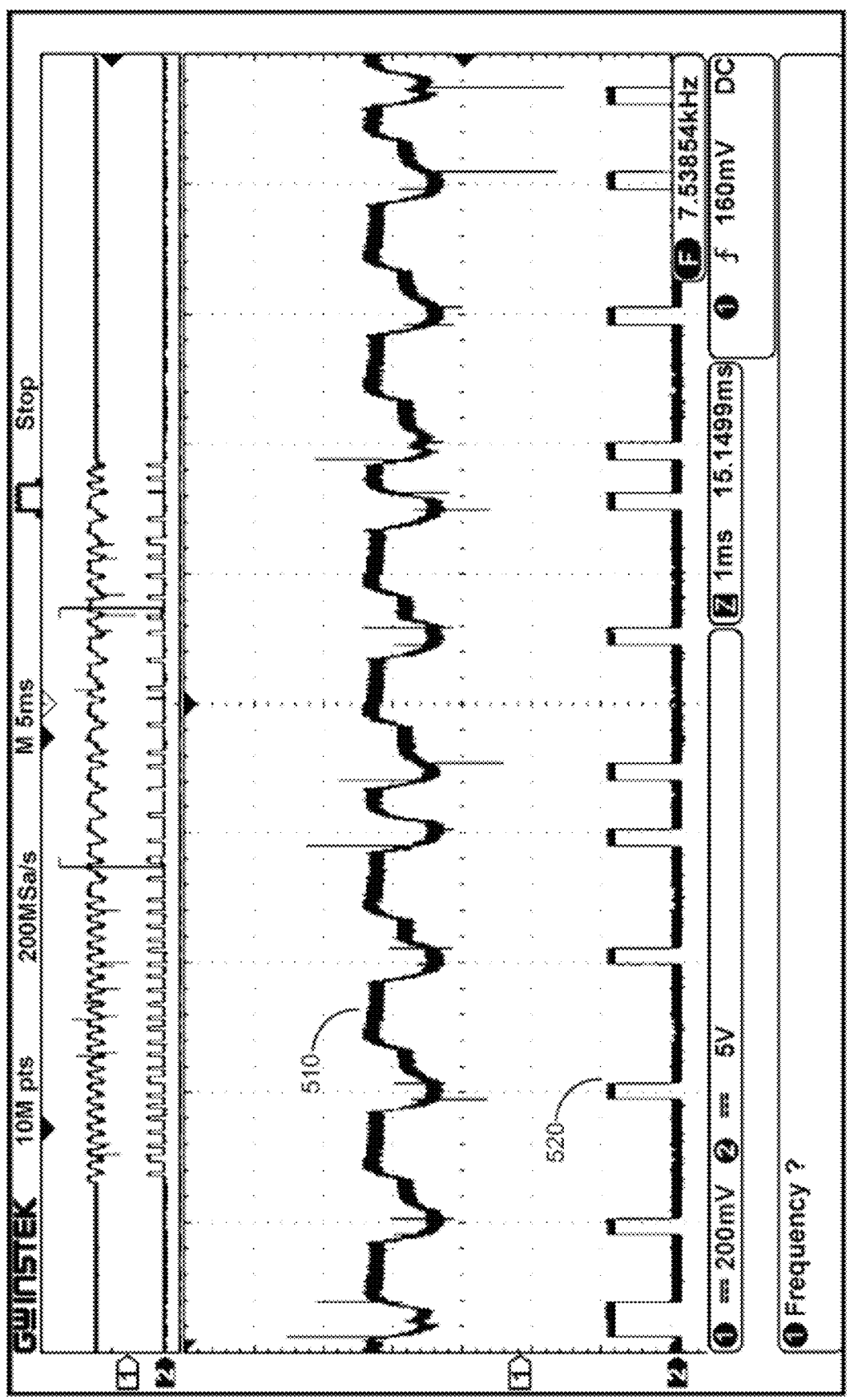
FIG. 5 illustrates the output of the adjustable sample-hold circuitry in the current sensing circuit when there is ASK modulated data in accordance with one aspect of the present disclosure.

FIG. 5 illustrates the output of the adjustable sample-hold circuitry in the current sensing circuit when there is ASK modulated data in accordance with one aspect of the present disclosure. The output of the differential amplifier (e.g., current sense amplifier 240) may amplify the voltage drop across a current sensing resistor (e.g., current sense resistor 120) due to ASK modulated current to generate the amplified voltage 510. The ASK modulation may be generated by the power receiving device using a resistive modulation scheme. The amplified voltage 510 may be sampled using an adjustable sample-hold circuitry to extract the sensed output 520 in the current path having sufficient modulation depth for use in ASK demodulation.

Figure 6:
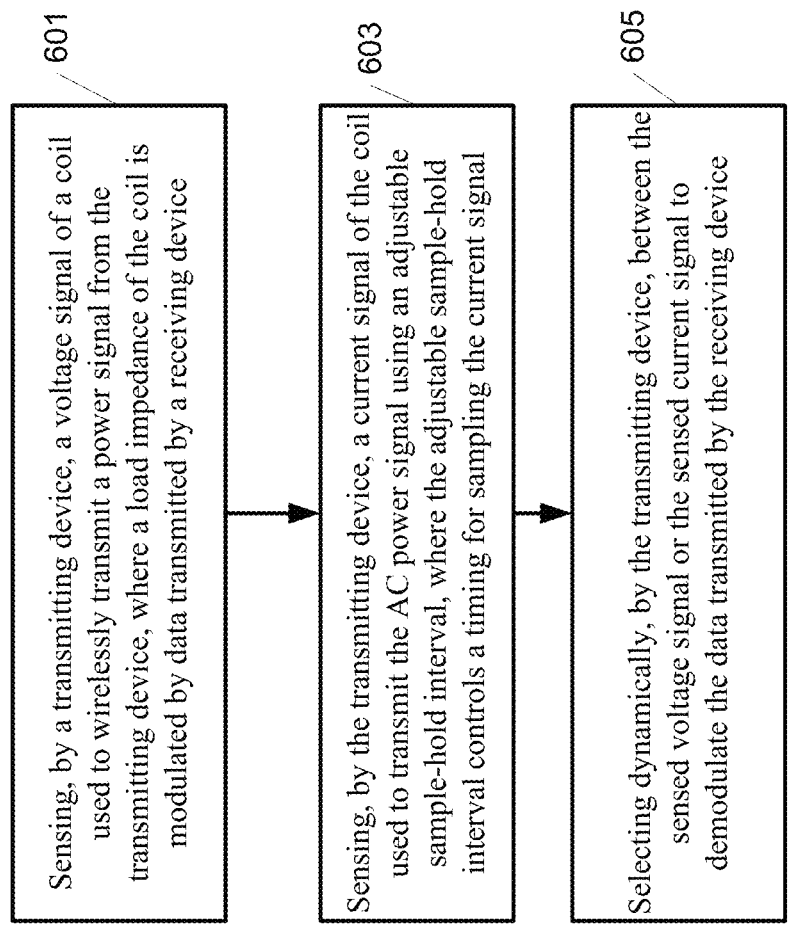
FIG. 6 illustrates a flow diagram of a method for selectively sensing the voltage and the current of the coil to demodulate the ASK data in accordance with one aspect of the present disclosure.

FIG. 6 illustrates a flow diagram of a method 600 for selectively sensing the voltage and the current of the coil to demodulate the ASK data in accordance with one aspect of the present disclosure. In one aspect, the method 600 may be performed by the power transmitting device utilising hardware, software, or combinations of hardware and software.

In operation 601, the power transmitting device may sense a voltage signal of a coil used to wirelessly transmit a power signal from the power transmitting device. The load impedance of the coil is modulated by data transmitted by a power receiving device.

In operation 603, the power transmitting device my sense a current signal provided to the coil using an adjustable sample-hold interval. The adjustable sample-hold interval controls a timing for sampling the current signal.

In operation 605, the power transmitting device may dynamically select between the sensed voltage signal or the sensed current signal to demodulate the data transmitted by the power receiving device.

Various embodiments of the techniques for using a sense amplifier for the voltage path having an adjustable gain and a current amplifier for the current path having an adjustable sample-hold interval for ASK demodulation described herein may include various operations. These operations may be performed and/or controlled by hardware components, digital hardware and/or firmware/programmable registers (e.g., as implemented in computer-readable medium), and/or combinations thereof. The methods and illustrative examples described herein are not inherently related to any particular device or other apparatus. Various systems (e.g., such as a wireless device including an antenna, a radio frequency (RF) transceiver, a controller operating in a near field environment, pico area network, wide area network, etc.) may be used in accordance with the teachings described herein, or it may prove convenient to construct more specialized apparatus to perform the required method steps. The required structure for a variety of these systems will appear as set forth in the description above.

Figure 7:
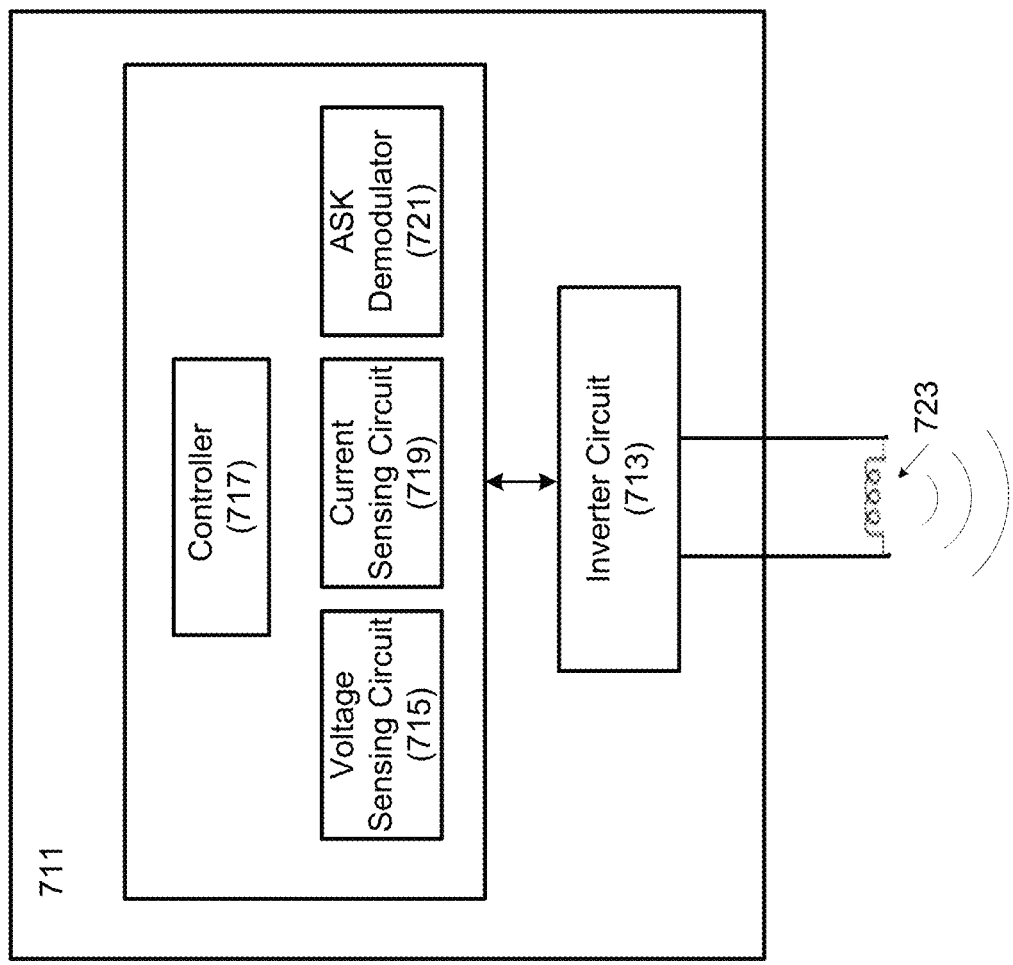
FIG. 7 is a block diagram of a wireless transmitting device showing the circuitry and the controller used to demodulate the ASK data in accordance with one aspect of the present disclosure.

FIG. 7 is a block diagram of a wireless transmitting device 711 showing the circuitry and the controller 717 used to demodulate the ASK data in accordance with one aspect of the present disclosure. The wireless transmitting device 711 may include an inverter circuit 713 to convert DC voltage to an AC square wave to drive the transmitter coil 723. The controller 717 may control the voltage, frequency, phase angle or duty cycle of the inverter circuit 713 to regulate the power transfer at a power receiving device.

A voltage sensing circuit 715 may sense the voltage of the transmitter coil 723 to generate a sensed voltage. The voltage sensing circuit 715 may have a differential amplifier with an adjustable gain to amplify the modulated voltage. The controller 717 may configure the adjustable gain to extract data with lower modulation depth.

A current sensing circuit 719 may sense the current flowing into the inverter circuit 713 to generate a sensed current. The current sensing circuit 710 may have a differential amplifier and a sampling circuit with an adjustable sample-hold interval to sample the modulated current of the differential amplifier. The controller 717 may control the adjustable sample-hold interval to provide a variable reference of a comparator used to compare the sample current to generate the sensed current. In one embodiment, the voltage path and the current path may have independent filter, programmable gain, comparator, and/or sample-and-hold paths to extract ASK data with low modulation depths and variable reflected load impedance while maintaining power regulation.

An ASK demodulator 721 may demodulate the sensed voltage from the voltage sensing circuit 715 or the sensed current from the current sensing circuit 719. The controller 717 may select the sensed voltage or the sensed current for demodulation by the ASK demodulator 721. In one embodiment, the controller 717 may adjust the gains of the voltage sensing circuit 715, adjust the sample-hold interval of the current sensing circuit 719, and/or change the selection of the sensed voltage or the sensed current for demodulation depending on the error rate under various loading, coupling scenarios, and phases of power transfer.

In one embodiment, the wireless transmitting device 711 may include a memory and a processing device (e.g., controller 717). The memory may be synchronous dynamic random access memory (DRAM), read-only memory (ROM)), or other types of memory, which may be configured to store the code to perform the function of the ASK demodulation. The processing device may be provided by one or more general-purpose processing devices such as a microprocessor, central processing unit, or the like. In an illustrative example, processing device may comprise a complex instruction set computing (CISC) microprocessor, reduced instruction set computing (RISC) microprocessor, very long instruction word (VLIW) microprocessor, or a processor implementing other instruction sets or processors implementing a combination of instruction sets. Processing device may also comprise one or more special-purpose processing devices such as an application specific integrated circuit (ASIC), a field programmable gate array (FPGA), a digital signal processor (DSP), network processor, or the like. The processing device may be configured to execute the operations described herein, in accordance with one or more aspects of the present disclosure, for performing the operations and steps discussed herein.

A computer-readable medium used to implement operations of various aspects of the disclosure may be non-transitory computer-readable storage medium that may include, but is not limited to, electromagnetic storage medium, magneto-optical storage medium, read-only memory (ROM), random-access memory (RAM), erasable programmable memory (e.g., EPROM and EEPROM), flash memory, or another now-known or later-developed non-transitory type of medium that is suitable for storing data and/or configuration information.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "may include", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing. For example, certain operations may be performed, at least in part, in a reverse order, concurrently and/or in parallel with other operations.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component.

Additionally, "configured to" or "configurable to" can include generic structure (e.g., generic circuitry) that is manipulated by firmware (e.g., an FPGA) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method for demodulating data by a wireless charging transmitting device, comprising:
   sensing a voltage signal of a coil used to wirelessly transmit a power signal from the wireless charging transmitting device, wherein a load impedance of the coil is modulated by data transmitted by a wireless charging receiving device;
   sensing a current signal of the coil used to transmit the power signal using an adjustable sample-hold interval, wherein the adjustable sample-hold interval controls a timing for sampling the current signal; and
   selecting dynamically between the sensed voltage signal or the sensed current signal to demodulate the data transmitted by the wireless charging receiving device.

2. The method of claim 1, wherein selecting dynamically between the sensed voltage signal or the sensed current signal comprises:
   selecting the sensed voltage signal to demodulate the data;
   determining whether the data demodulated using the sensed voltage signal has a data error rate higher than a threshold or the data demodulated is static; and
   switching to using the sensed current signal to demodulate the data when the data error rate is determined to be higher than the threshold or the data demodulated using the sensed voltage signal is determined to be static.

3. The method of claim 1, wherein sensing the current signal of the coil comprises:
   sampling the current signal of the coil using a first sample-hold interval;
   determining whether the data demodulated using the sensed current signal has a data error rate higher than a threshold or the data demodulated is static; and
   sampling the current signal of the coil using a second sample-hold interval when the data error rate is determined to be higher than the threshold or the data demodulated using the sensed current signal is determined to be static.

4. The method of claim 3, wherein sensing the current of the coil further comprises:
   comparing the current signal sampled using the adjustable sample-hold interval with a reference signal to generate the sensed current signal.

5. The method of claim 4, wherein sampling the current signal of the coil using the second sample-hold interval comprises:
   changing effectively the reference signal used to compare the current signal sampled using the first sample-hold interval and the current signal sampled using the second sample-hold interval.

6. The method of claim 1, wherein sensing the voltage signal of the coil comprises:
   amplifying variations in the voltage signal with a first adjustable gain, the variations in the voltage signal resulting from the load impedance of the coil being modulated by the data.

7. The method of claim 6, wherein sensing the voltage signal of the coil further comprises:
   determining whether the data demodulated using the sensed voltage signal has a data error rate higher than a threshold or the data demodulated is static; and
   changing the first adjustable gain when the data error rate is determined to be higher than the threshold or the data demodulated using the sensed voltage signal is determined to be static.

8. The method of claim 6, wherein sensing the voltage signal of the coil further comprises:
   sampling the variations in the voltage signal amplified using the first adjustable gain; and
   comparing the variations in the voltage signal sampled with an adjustable reference signal to generate the sensed current signal.

9. The method of claim 6, wherein sensing the current signal of the coil comprises:
   amplifying variations in the current signal with a second adjustable gain, the variations in the current signal resulting from the load impedance of the coil being modulated by the data, wherein the first adjustable gain and the second adjustable gain are controlled independently.

10. The method of claim 1, wherein the power signal transmitted by the wireless charging transmitting device comprises an alternating current (AC) signal of a first frequency, and wherein the data transmitted by the wireless charging receiving device modulates an amplitude of the AC signal at a second frequency, wherein the second frequency is lower than the first frequency.

11. An apparatus comprising:
    a coil configured to wirelessly transmit a power signal, wherein a load impedance of the coil is modulated by data transmitted by a receiving device receiving the power signal;
    a voltage sensing circuit configured to sense a voltage signal of the coil;
    a current sensing circuit configured to sense a current signal of the coil using an adjustable sample-hold interval, wherein the adjustable sample-hold interval controls a timing used to sample the current signal; and
    a processor configured to:
    select dynamically between the sensed voltage signal from the voltage sensing circuit or the sensed current signal from the current sensing circuit to demodulate the data transmitted by the receiving device.

12. The apparatus of claim 11, wherein to select dynamically between the sensed voltage signal from the voltage sensing circuit or the sensed current signal from the current sensing circuit, the processor is configured to:
- select the sensed voltage signal to demodulate the data;
- determine whether the data demodulated using the sensed voltage signal has a data error rate higher than a threshold or the data demodulated is static; and
- select the sensed current signal to demodulate the data when the data error rate is determined to be higher than the threshold or the data demodulated using the sensed voltage signal is determined to be static.

13. The apparatus of claim 11, wherein the processor is further configured to:
- control the current sensing circuit to sample the current signal of the coil using a first sample-hold interval;
- determine whether the data demodulated using the sensed current signal has a data error rate higher than a threshold or the data demodulated is static; and
- control the current circuit to sample the current signal of the coil using a second sample-hold interval when the data error rate is determined to be higher than the threshold or the data demodulated using the sensed current signal is determined to be static.

14. The apparatus of claim 13, wherein the current sensing circuit is further configured to:
- compare the current signal sampled using the adjustable sample-hold interval with a reference signal to generate the sensed current signal.

15. The apparatus of claim 14, wherein when the current sensing circuit samples the current signal of the coil using the second sample-hold interval, the current sensing circuit is configured to effectively change the reference signal used to compare the current signal sampled using the first sample-hold interval and the current signal sampled using the second sample-hold interval.

16. The apparatus of claim 11, wherein the voltage sensing circuit is further configured to:
- amplify variations in the voltage signal with a first adjustable gain, wherein the variations in the voltage signal result from the load impedance of the coil being modulated by the data.

17. The apparatus of claim 16, wherein the processor is further configured to:
- determine whether the data demodulated using the sensed voltage signal has a data error rate higher than a threshold or the data demodulated is static; and
- change the first adjustable gain when the data error rate is determined to be higher than the threshold or the data demodulated using the sensed voltage signal is determined to be static.

18. The apparatus of claim 16, wherein the voltage sensing circuit is further configured to:
- sample the variations in the voltage signal amplified using the first adjustable gain; and
- compare the variations in the voltage signal sampled with an adjustable reference signal to generate the sensed current signal.

19. The apparatus of claim 16, wherein the current sensing circuit is further configured to:
- amplify variations in the current signal with a second adjustable gain, wherein the variations in the current signal result from the load impedance of the coil being modulated by the data, and wherein the first adjustable gain and the second adjustable gain are controlled independently.

20. The apparatus of claim 11, wherein the power signal transmitted by the apparatus comprises an alternating current (AC) signal of a first frequency, and wherein the data transmitted by the receiving device modulates an amplitude of the AC signal at a second frequency, wherein the second frequency is lower than the first frequency.

* * * * *